United States Patent

Lazarski et al.

(10) Patent No.: US 7,438,472 B1
(45) Date of Patent: Oct. 21, 2008

(54) AUTOMATIC CRYOLOOP ALIGNMENT FOR PROTEIN CRYSTALS

(75) Inventors: Krzysztof Z. Lazarski, Darien, IL (US); Andrzej Joachimiak, Bolingbrook, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 11/774,679

(22) Filed: Jul. 9, 2007

(51) Int. Cl.
*A61B 6/08* (2006.01)
(52) U.S. Cl. .................... 378/205; 378/73; 378/98.5
(58) Field of Classification Search ............ 378/70–81, 378/98.5, 204–208
See application file for complete search history.

(56) References Cited

U.S. PATENT DOCUMENTS 6,404,849 B1 * 6/2002 Olson et al. .................... 378/79
7,274,769 B2 * 9/2007 Nordmeyer et al. ........... 378/80

\* cited by examiner

*Primary Examiner*—Jurie Yun
(74) *Attorney, Agent, or Firm*—Joan Pennington

(57) ABSTRACT

Methods and apparatus for implementing robust and efficient cryoloop auto-centering for crystal location and alignment to the x-ray beam are provided. Image processing techniques are used for recognition of the small protein crystals. The detected crystal location enables crystal positioning in the x-ray beam, and optimization of the x-ray optics such as beam profile and intensity to the size and shape of the protein crystals.

20 Claims, 3 Drawing Sheets

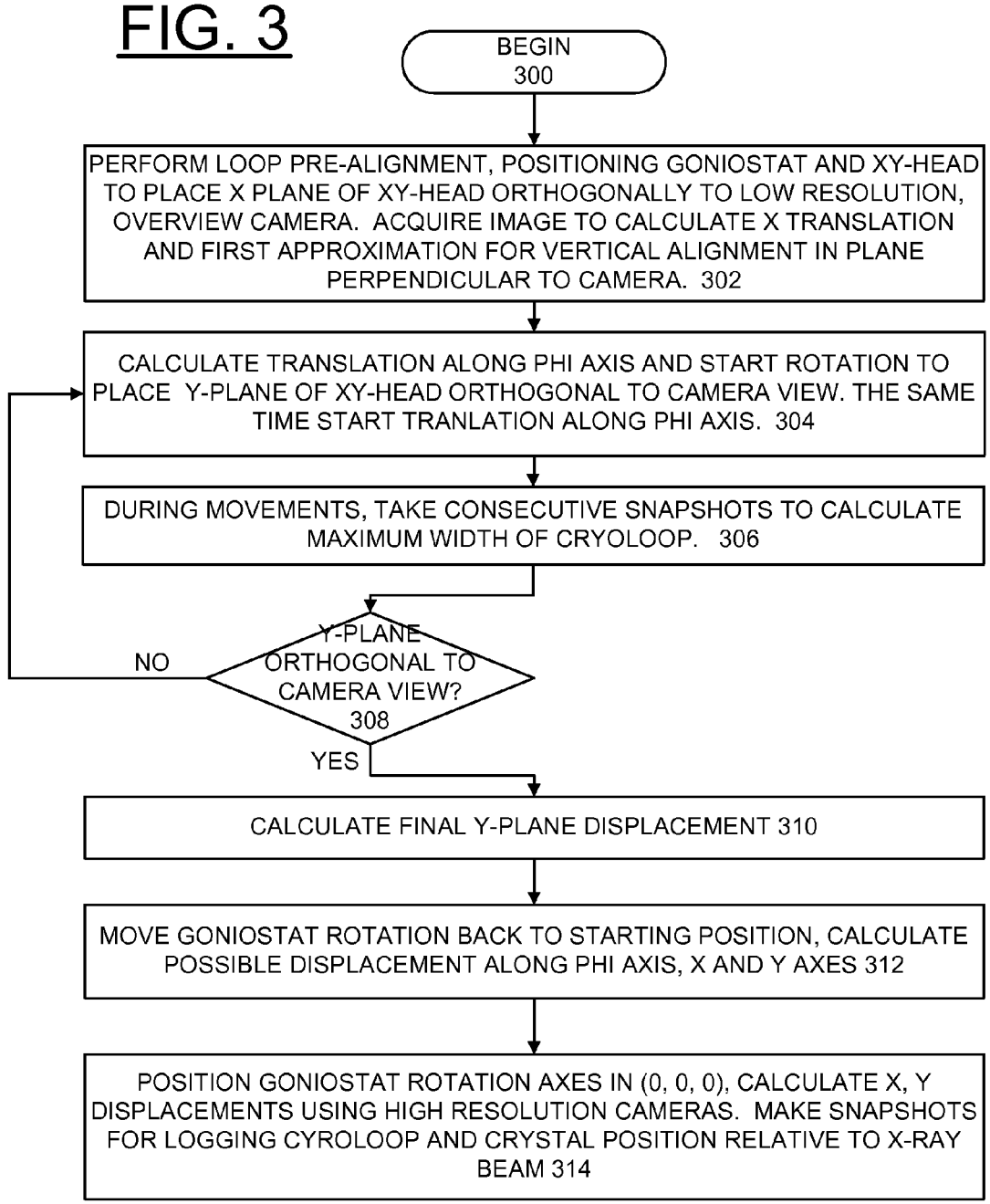

AUTOMATIC CRYOLOOP ALIGNMENT FOR PROTEIN CRYSTALS

CONTRACTUAL ORIGIN OF THE INVENTION

The United States Government has rights in this invention pursuant to Contract No. W-31-109-ENG-38 between the United States Government and The University of Chicago and/or pursuant to Contract No. DE-AC02-06CH11357 between the United States Government and UChicago Argonne, LLC representing Argonne National Laboratory.

FIELD OF THE INVENTION

The present invention relates to an improved method for the alignment of protein crystals in a facility, such as the Structural Biology Center's (SBC) national user facility for macromolecular crystallography, and more particularly to an automated method for implementing precise alignment of protein crystals in an x-ray beamline in the national user facility for macromolecular crystallography.

DESCRIPTION OF THE RELATED ART

Macromolecular crystallography utilizes synchrotron radiation for rapid solution of structure of biological molecules and in recent years nearly 80% protein crystal structures are determined using data obtained at synchrotron facilities. Biological molecules are grown into single crystals and placed in the x-ray beam using loop holders cryocooled with cold nitrogen gas. A small size x-ray synchrotron beam with beamline dependent spot sizes as small as 70 µm (bending magnet beamlines) and 20 µm (undulator beamlines) is focused at or downstream of the crystal sample. Ideally the x-ray beam spot size should match the size of the crystal. Since protein crystals are small, typically 500-50 microns cube, they need to align with x-ray beam with aid of high magnification cameras. Protein crystals are highly variable in diffraction quality; therefore one of the tasks involves searching for highest quality crystals using robotics. Crystal screening task is repetitive, includes several of the same steps and is well suited to automation process, utilizing robotics for mechanical manipulation and image processing techniques for detection and location of protein crystal.

U.S. Pat. No. 7,162,888, issued Jan. 16, 2007 to Deming Shu, Andrzej Joachimiak, Curt A. Preissner, Daniel Nocher, Yufeng Han, Yuan Barraza, Peter Lee, Wah-Keat Lee, Zhonghou Cai, Stephan Ginell, Randy Alkire, Robert G. Schuessler, and assigned to the present assignee, discloses a method and robot-based automation system for cryogenic crystal sample mounting, for example, for use for cryogenic crystal sample mounting in the x-ray crystallography station at an x-ray source. The system includes a robot arm carrying a handset. The handset includes a pair of elongated fingers for sample mounting, and each finger carrying a set of strain gauge arrays for providing force sensing. A slim finger design allows a sample mounting process with no interference with the beam stop, cryostreem and x-ray detectors. The handset can detect the contact force intensity and direction; provide a precise gripping action; and feel the results of the gripping. The finger design incorporates a mechanism to maintain the sample temperature well below the cryogenic safety margin for the crystal viability. A Dewar container is provided with an ice control system and liquid nitrogen flow control. A triangular sample magazine maximizes the Dewar space usage. A miniature kinematical mounting sample holder provides near micron positioning repeatability. These capabilities make the robot-arm more powerful, flexible, and reliable.

The subject matter of the above-identified U.S. Pat. No. 7,162,888 is incorporated herein by reference.

The Structural Biology Center's (SBC) is a national user facility for macromolecular crystallography with state-of-the-art capabilities that serves broad macromolecular crystallography community. For data collection using x-ray crystallography the crystal sample must be aligned with the x-ray beam to assure that equal crystal volume is exposed to x-ray during crystal rotation. Typically the center of protein crystal needs to be placed ~10 microns from the center of the x-ray beam. This minimizes errors in recording diffraction peaks, improves quality especially for weak data and improves detection of weak anomalous signal for structure determination.

At synchrotron facilities a majority of diffraction data are collected from crystals mounted in cryoloops. To minimize errors in recording diffraction peaks and improve detection of weak anomalous signal, the crystal sample must be aligned with the x-ray beam to assure that equal crystal volume is exposed to x-rays during crystal rotation.

Traditionally at synchrotron facilities crystals were mounted and aligned manually. This is time consuming and inefficient. Moreover, the use of crystal mounting robots, the need for rapid screening to find the best crystal and the development of remote data collection capabilities generally require automated sample alignment.

Important aspects of the present invention are to provide an improved method and apparatus for implementing precise alignment of protein crystals in an x-ray beamline in the national user facility for macromolecular crystallography applications, to provide such improved method and apparatus substantially without negative effect and that overcome some of the disadvantages of prior art arrangements.

SUMMARY OF THE INVENTION

In brief, methods and apparatus for implementing robust and efficient cryoloop auto-centering for crystal location and alignment to the x-ray beam are provided. Image processing techniques are used for recognition of the small protein crystals. The detected crystal location enables crystal positioning in the x-ray beam, and optimization of the x-ray optics such as beam profile and intensity to the size and shape of the protein crystals.

In accordance with features of the invention, the automatic cryoloop alignment method uses specific crystal illumination and camera viewing conditions along with advanced and reliable image recognition to calculate displacement in three-dimensions (3-D) between the cryoloop and the x-ray beam.

The method of the invention allows efficient and effective automated alignment of the loop with the x-ray beam for initial crystal screening. The alignment can be further improved with further processing. The automated alignment procedure has been successfully tested on a large number of samples.

BRIEF DESCRIPTION OF THE DRAWINGS

The present invention together with the above and other objects and advantages may best be understood from the following detailed description of the preferred embodiments of the invention illustrated in the drawings, wherein:

FIG. 3 is a flow chart illustrating exemplary steps for implementing crystal location and alignment to the x-ray beam in the crystal alignment system of FIG. 1 in accordance with the preferred embodiment.

DETAILED DESCRIPTION OF THE PREFERRED EMBODIMENTS

Figure 1:
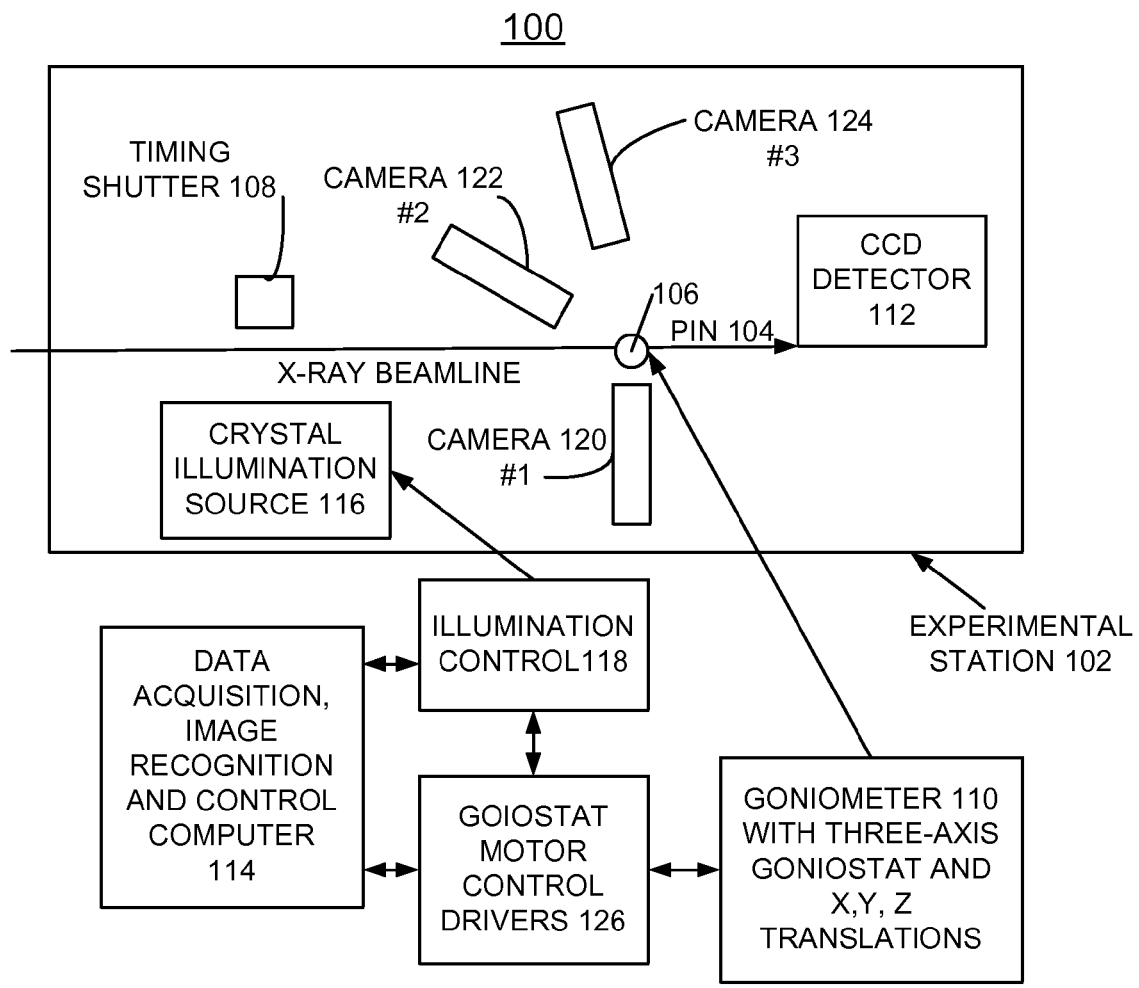
FIG. 1 is a block diagram illustrating an exemplary automated crystal alignment system in accordance with the preferred embodiment.

Having reference now to the drawings, FIG. 1 illustrates an exemplary automated crystal alignment system generally designated by reference character 100 in accordance with the preferred embodiment. Automated crystal alignment system 100 includes an experimental station or hutch 102 receiving an x-ray beamline and containing a pin 104 mounting a crystal sample 106.

Figure 2:
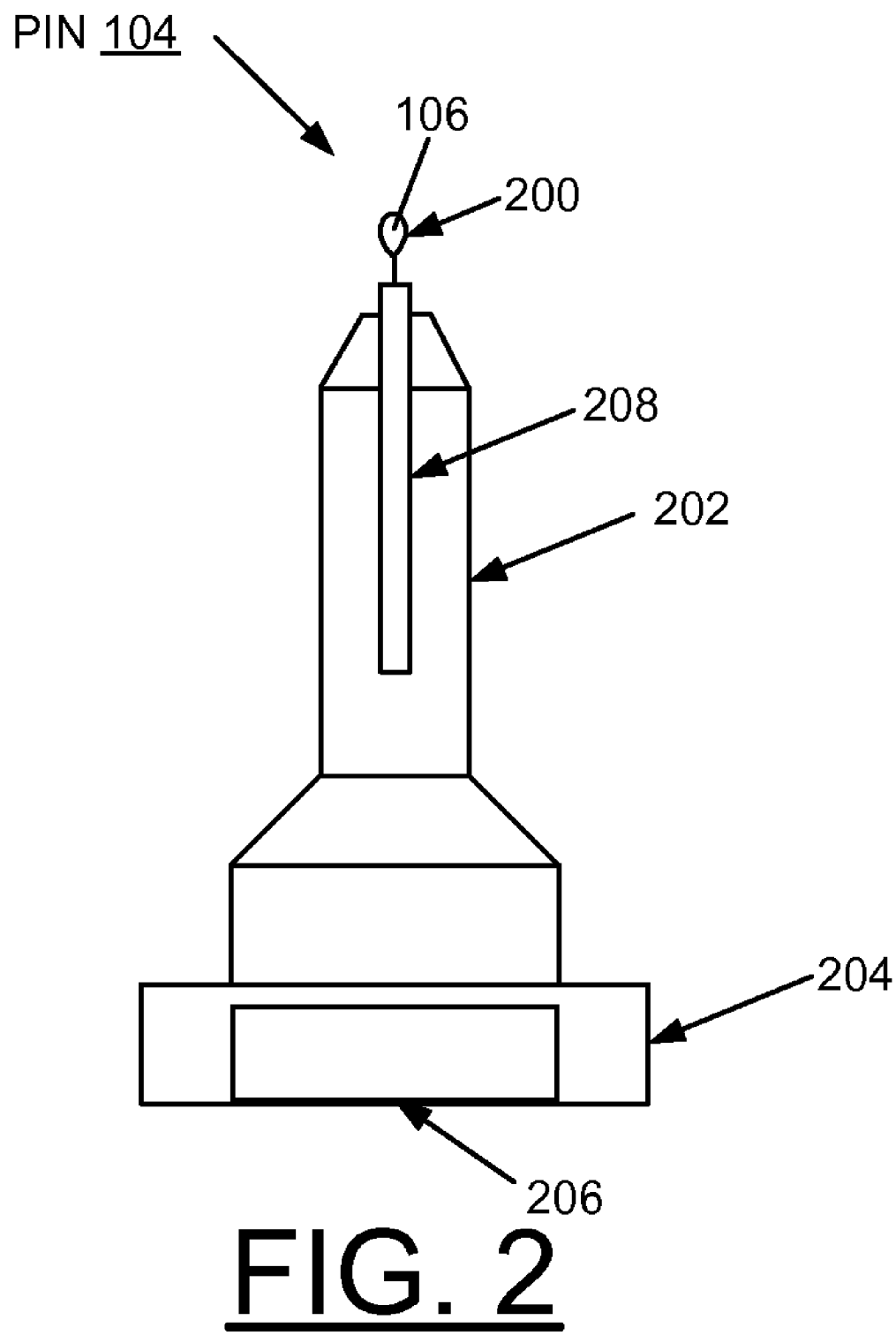
FIG. 2 is a schematic diagram illustrating an exemplary pin for implementing cryoloop auto-centering for crystal location and alignment to the x-ray beam in the crystal alignment system of FIG. 1 in accordance with the preferred embodiment.

An exemplary pin 104 for implementing cryoloop auto-centering for crystal location and alignment to the x-ray beam in the crystal alignment system 100 is illustrated and described with respect to FIG. 2.

Monochromatic x-ray beam enters the experimental hutch 102 where it can be attenuated by computer-controlled placement of different thickness attenuators (not shown) in the x-ray beam. A timing x-ray photon shutter 108 can open or close the x-ray beam within few milliseconds.

Automated crystal alignment system 100 includes a goniometer 110 equipped with a three-axis kappa goniostat and X, Y, Z translations. All goniostat motors are computer controlled, with each goniostat 110 allowing precise rotation and placement of crystal specimen 106 in the x-ray beam. Goniostat 110 includes omega rotation with horizontal axis of rotation perpendicular to the x-ray beam. On top of omega motor stage a kappa rotation is mounted which allows rotation of a crystal around axis positioned at 37 degree angle with respect to omega axis. On top of kappa motion, a precision miniature X-Y-Z stage with a magnetic mounting base allows positioning of the next stage within any point in space bounded by 200 μm×200 μm×2 mm cube. On top of X-Y-Z stage, there is a phi rotation with axis of rotation perpendicular to x-y plane (rotation around z axis).

Protein crystals are held near liquid nitrogen temperature by constant flow stream of cold nitrogen gas from cryostat (not shown). A beam-stop (not shown) prevents the primary x-ray beam from hitting a mosaic CCD detector 112. The CCD detector 112 collects the diffraction images from the crystal 106. The diffraction images are processed by a data acquisition, image recognition and control computer 114 that performs data acquisition, with crystallographic software and the diffraction images are used in crystal structure determination.

The present invention provides an effective solution to one of the major bottlenecks in the x-ray data collection process, that is the constant need to change and realign the crystal samples. Typically this has been a very time and manpower consuming task. The time it takes to change and realign the sample (together with the time it takes to go into and out of the experiment station) often has exceeded the time required to collect data. The present invention provides an automated alignment of the protein crystal in the x-ray beam.

Automated crystal alignment system includes a crystal illumination source 116 operatively controlled by an illumination control 118 coupled to the data acquisition, image recognition and control computer 114. Two methods of crystal illumination have been implemented including reflected light from two focused fiber optic light guiding sources or transmitted light from mats, back illumination by white light LEDs.

Automated crystal alignment system includes a pair of two high-magnification, long-working distance microscopes with high-resolution CCD color camera systems 120, #1, and 122, #2, and a low-magnification low-resolution monochrome camera 124, #3 are directed at the sample 106. The high-resolution CCD color cameras 120, #1, and 122, #2 are mounted at ~135° to each other so that crystal alignment may be performed efficiently without rotating the crystal about the ϕ axis. The visualization of macromolecular crystals is difficult especially for small crystals when there is minimal or no contrast between the crystal and the thin film of liquid it is frozen in. The CCD camera images are viewed on two high-resolution computer screens, using custom display software which displays the CCD images, an alignment cross for the x-ray beam center and a box indicating the beam size.

The low magnification overview camera 124, #3 is implemented by, for example, a Watec model 903 black/white camera. The optics of camera 124, #3 provides ~1× magnification, and is at a working distance of 170 mm from the crystal 106. The overview camera 124, #3 is placed 5 degrees from vertical position, on looking into bottom camera 129m #1.

Each of the high-resolution CCD color cameras 120, #1, and 122, #2 is implemented by, for example, a high resolution Hitachi HV-C20, 3CCD camera with K2 and CF-3 Infinity optics used. The high-resolution optical microscope cameras 120, #1, and 122, #2 are placed at working distance of 140 mm from the crystal 106. The Infinity long working distance microscope K2 with CF-3 objective, zoom, and DL lenses provide approximately 10× magnification of the loop area. The first high magnification camera 120, #1 is placed below the sample 106. The second high magnification camera 122m #2 is placed at ~135 degrees away from the first camera 120, #1 in the plane containing x-ray beam.

Automated crystal alignment system includes goniostat motor control drivers 126 coupled to the data acquisition, image recognition and control computer 114 providing computer control to all goniostat motors of goniometer 110.

The automated crystal alignment system 100 is shown in simplified form sufficient for understanding the present invention. It should be understood that the present invention is not limited to the illustrated automated crystal alignment system 100; various other arrangements could be used. For example multiple computers could be used to implement the data acquisition, image recognition and control computer 114.

Referring now to FIG. 2, there is shown an exemplary pin 104 for implementing cryoloop auto-centering for crystal location and alignment to the x-ray beam in the crystal alignment system 100 in accordance with the preferred embodiment. At synchrotron facilities diffraction data are collected from crystals 106 that are mounted in cryoloops and cryocooled with cold nitrogen of helium gas at temperatures from 100K to 10K to effectively mitigate radiation damage in macromolecular crystallography.

Crystals 106 are mounted within a drop of liquid held by the cryoloop 200 at the tip of pin 104 as shown in FIG. 2 and flash frozen in liquid nitrogen or similar cryogen. Pin 104 includes a pedestal 202 with a base 204 that is attached to goniometer 110 through magnetic mount. The base 204 of the pin 104 contains ferromagnetic material 206. The ferromagnetic base 204 enables effective mounting of the pin on the goniostat 110, and within pucks (not shown), with the pucks containing a permanent magnet allowing attachment of pins 104 in the puck. Pin 104 includes a microtube 208 inserted to the bottom of the pin top 202; with the cryoloop 200 located a set distance, such as 1 mm, above the microtube 208.

Referring now to FIG. 3, there are shown exemplary steps for implementing crystal location and alignment to the x-ray beam in the crystal alignment system 100 in accordance with the preferred embodiment starting at a block 300.

In accordance with features of the invention, automatic cryoloop recognition is provided with the low-resolution camera 124, #3 using specific crystal illumination conditions provided by crystal illumination source 116, and performing the cryoloop alignment during the closing of a hutch door, such as within approximately 53 seconds.

During the alignment process, specific lights are being turned on and off as needed as well as reflectors being used to create the best condition for highly reliable image processing algorithms, such as Minkowski morphological operators, histogram data and filling algorithms, to be able to establish the center of the cryoloop 200. The sample 106 is moved in such a way that the specific calculated point near the tip of the cryoloop 200 is placed in the center of x-ray beam. This provides better conditions and simplifies fine tuning alignment. Further improved crystal alignment is provided using high resolution cameras 120, #1 and 122, #2.

In accordance with features of the invention, automatic cryoloop recognition algorithm starts with performing loop pre-alignment, positioning goniostat and xy-head to achieve orthogonal arrangement of one of the axis of the xy-head with top zoomed out camera 124, #3, and an image is acquired to calculate X translation as indicated at a block 302.

The goal of that step is to place the cryoloop 200 containing crystal 106 into the view of the two high magnification cameras 120, #1, 122, #2 using the third independent overlook camera 124, #3, which is placed 97 degrees from the beam direction above the cryoloop. The covered vertical range by this camera 124, #3 is about 5 mm. The traveling distance for xy-stage in x direction is 5 mm, in y direction 4 mm.

In accordance with the invention, when alignment is started, omega, phi and kappa are reset to zero degree and the first image is taken for morphological image processing. Because of using traditional and well established algorithms the image processing is taking a fraction of the second. Next, omega is moving to −90 degree and second image is taken and processed. After calculations are done xy-stage together with phi translation stage are moving to calculated positions, placing cryoloop in the field of view of two high magnification cameras for further alignment. During alignment, lights needed for proper illumination are turned on and off and omega is moving between 0 and −90 degree. The whole process is taking not more than 30 seconds. After prealignment is done omega is moved to 0 degree.

An initial picture is taken at block 302 to calculate X translation or horizontal translation on the image along phi axis and a first approximation for vertical alignment in the plane perpendicular to camera. Immediately after the image is taken the horizontal translation movement is started. To finish horizontal alignment several consecutive translations are calculated depending on the visibility of the loop in horizontal view as indicated at a block 304.

During the rotational movement several snapshots are taken to calculate displacement of the cryoloop in several planes, and the maximum width of the cryoloop as indicated at a block 306. Because of only estimated position of rotation angle, these calculations are only good approximations of real displacements.

The image processing procedures, which are used to find the center of the loop 200 consist of several steps. The first step is to find the tip of the cryoloop 200. Next images are combined to calculate maximum size in vertical planes of the cryoloop 200. Then the loop center is established and the point toward the tip of the loop is chosen as an alignment center. This special selection is made to accelerate future phi translation movements in horizontal plane.

After positioning the goniostat so the other axis of the xy-head is orthogonal to camera view as indicated at a decision block 308, the final vertical displacement is calculated as indicated at a block 310 and accomplished and all previous calculated values are checked for consistency with real motor positions as indicated at a block 312.

After the cryoloop 200 is placed in the field of view of high magnification cameras 120, #1, 122, #2, precise alignment of the loop is initiated, which includes identifying physical properties of the loop such as extreme points of the loop in each direction. However, of interest to crystal centering is the loop center of mass point, which is placed subsequently in the center of the x-ray beam. Images obtained with each high magnification camera 120, #1, 122, #2, are processed with a binary mask used in calculations.

In accordance with the invention, methods of protein crystal location explore physical properties differentiating crystal from the surrounding environment. Crystal differentiating properties include optically visible difference (shadows, reflections), as well as fluorescence. We have explored technique of location of the crystal using image processing techniques in visible light as unreliable to date. A binary mask is used during image processing in search for crystal contained in the loop. There is a correlation between crystal position and identified feature. Additional effort is needed to obtain high reliability of this method. Image processing techniques using fluorescence from protein crystals has been explored and found it promising. Visualization of macromolecular crystals using fluorescence is an alternative option. Preliminary experiments with crystal visualization have been conducted using ultraviolet (UV) light instead of visual light for crystal illumination. Lysozyme crystals illuminated with UV light at 280 nm yield emission spectrum at 340-360 nm, thus allowing for easy and rapid differentiation between crystal and mounting liquid. This is true even for very small crystals, when viewed using high magnification long-distance microscopes and a high-resolution color CCD camera.

Also testing visible fluorescence from crystals grown in the presence of fluorescence dyes and illuminated with a green laser (594 nm) has been performed. Such an approach would greatly simplify crystal centering. However, not all crystals can be labeled with such dyes. Therefore, further algorithms must be developed for crystal detection, together with upgrading visualization equipment to be able to detect and center 5-10 μm crystals.

The final movements are executed to position goniostat rotation axes in (0,0,0), calculating x, y displacements using the high resolution cameras 120, #1, 122, #2 and snapshots are taken for logging purposes as indicated at a block 314. This concludes alignment process with the whole process taking less then 1 minute.

In conclusion, combination of image processing techniques and robotics enable automation of protein crystal alignment and screening task. Visible light image processing allows alignment of the crystal loop. Ultraviolet fluorescence is a promising technique for identification and centering the protein crystal.

Auto-loop-alignment has been successful in all 333 cases in placing the cryoloop 200 into the x-ray beam. In 80% of these cases alignment was adequate to start data collection without additional corrections. This was achieved by careful calibration and mapping the view of the low resolution camera 124, #3 to views of the high resolution cameras 120, #1, 122, #2.

While the present invention has been described with reference to the details of the embodiments of the invention shown in the drawing, these details are not intended to limit the scope of the invention as claimed in the appended claims.

What is claimed is:

1. A method for implementing crystal alignment in an x-ray beamline for macromolecular crystallography using an overview camera and a pair of high resolution cameras, said method comprising the steps of:
   providing a pin mounting a cryoloop containing the crystals to be aligned with the x-ray beamline;
   providing a goniometer equipped with a three-axis kappa goniostat and X, Y, Z translation stages and mounting said pin on said goniometer;
   using the overview camera; capturing images of said cryoloop containing the crystals while moving said pin using said goniometer;
   performing image processing of said captured images and locating the cryoloop relative to the pair of high resolution cameras;
   using the pair of high resolution cameras, capturing high resolution images of said cryoloop containing the crystals while moving said pin using said goniometer; and
   performing image processing of said captured high resolution images and aligning said cryoloop and crystals with the x-ray beamline.

2. The method for implementing crystal alignment as recited in claim 1 includes providing a low resolution camera for the overview camera, said low resolution camera providing low image magnification.

3. The method for implementing crystal alignment as recited in claim 1 includes providing a crystal illumination source, and controlling said crystal illumination source for providing predefined crystal illumination conditions for illuminating the crystals while capturing images.

4. The method for implementing crystal alignment as recited in claim 1 wherein using the pair of high resolution cameras, capturing high resolution images include providing high image magnification with the pair of high resolution cameras.

5. The method for implementing crystal alignment as recited in claim 1 wherein performing image processing of said captured images and aligning said cryoloop and crystals with the x-ray beamline includes identifying an end of said cryoloop.

6. The method for implementing crystal alignment as recited in claim 1 wherein performing image processing of said captured images and aligning said cryoloop and crystals with the x-ray beamline includes identifying a center of mass of said cryoloop.

7. The method for implementing crystal alignment as recited in claim 1 includes providing a low resolution camera for the overview camera disposed above said pin.

8. The method for implementing crystal alignment as recited in claim 1 wherein using the pair of high resolution cameras, capturing high resolution images include mounting the pair of high resolution cameras at a predefined angle relative to each other and at a set working distance from said cryoloop containing the crystals to be aligned with the x-ray beamline.

9. The method for implementing crystal alignment as recited in claim 8 wherein said set working distance is approximately 170 mm.

10. The method for implementing crystal alignment as recited in claim 8 wherein said predefined angle is approximately 135°.

11. The method for implementing crystal alignment as recited in claim 8 wherein said set working distance is approximately 140 mm.

12. The method for implementing crystal alignment as recited in claim 1 wherein using the overview camera; capturing images of said cryoloop containing the crystals while moving said pin using said goniometer includes capturing images for collecting data by rotation of the crystal axes.

13. The method for implementing crystal alignment as recited in claim 1 includes providing a UV light crystal illumination source, and controlling said UV light crystal illumination source for providing predefined crystal illumination conditions for illuminating the crystals while capturing images.

14. The method for implementing crystal alignment as recited in claim 1 wherein performing image processing includes using image recognition techniques to calculate displacement in three-dimensions between said cryoloop and the x-ray beam position.

15. Apparatus for implementing crystal alignment in an x-ray beamline for macromolecular crystallography comprising:
   an overview camera;
   a pair of high resolution cameras,
   a pin mounting a cryoloop containing the crystals to be aligned with the x-ray beamline;
   a goniometer equipped with a three-axis kappa goniostat and X, Y, Z translation stages for mounting said pin on said goniometer;
   a data acquisition, image recognition and control computer coupled to said goniometer and said overview camera for capturing images of said cryoloop containing the crystals while moving said pin;
   said data acquisition, image recognition and control computer performing image processing of said captured images and locating the cryoloop relative to said pair of high resolution cameras;
   said data acquisition, image recognition and control computer coupled to said pair of high resolution cameras for capturing high resolution images of said cryoloop containing the crystals while moving said pin using said goniometer; and
   said data acquisition, image recognition and control computer performing image processing of said captured high resolution images and aligning said cryoloop and crystals with the x-ray beamline.

16. Apparatus for implementing crystal alignment in an x-ray beamline for macromolecular crystallography as recited in claim 15 wherein said overview camera includes a low resolution camera providing low image magnification.

17. Apparatus for implementing crystal alignment in an x-ray beamline for macromolecular crystallography as recited in claim 15 wherein each of said pair of high resolution cameras include a color camera providing high image magnification.

18. Apparatus for implementing crystal alignment in an x-ray beamline for macromolecular crystallography as recited in claim 15 wherein said pair of high resolution cameras are mounted at a predefined angle relative to each other and at a set working distance from said cryoloop containing the crystals to be aligned with the x-ray beamline.

19. Apparatus for implementing crystal alignment in an x-ray beamline for macromolecular crystallography as recited in claim 18 wherein said predefined angle is approximately 135° and said set working distance is approximately 140 mm.

20. Apparatus for implementing crystal alignment in an x-ray beamline for macromolecular crystallography as recited in claim 15 includes a crystal illumination source, and said data acquisition, image recognition and control computer controlling said crystal illumination source for providing predefined crystal illumination conditions for illuminating the crystals while capturing images.

* * * * *